United States Patent

Li et al.

Patent Number: 5,372,749
Date of Patent: Dec. 13, 1994

[54] METHOD FOR SURFACE TREATING CONDUCTIVE COPPER POWDER WITH A TREATING AGENT AND COUPLER

[75] Inventors: Jiang Li; Xijin Pan; Shoudong You; Shixiong Huang, all of Beijing, China

[73] Assignee: Beijing Technology of Printing Research Institute Chinese, Beijing, China

[21] Appl. No.: 33,746

[22] Filed: Mar. 18, 1993

Related U.S. Application Data

[63] Continuation-in-part of Ser. No. 897,654, Jun. 11, 1992, abandoned.

[30] Foreign Application Priority Data

Feb. 19, 1992 [CN] China ............................... 92100920.8

[51] Int. Cl.⁵ ............................................. H01B 1/02
[52] U.S. Cl. .................................. 252/512; 252/514; 427/216
[58] Field of Search ................. 427/216, 220; 252/512, 252/514, 518, 520; 428/403, 405; 75/255; 106/1.13, 1.14

[56] References Cited

U.S. PATENT DOCUMENTS

| | | | |
|---|---|---|---|
| 4,273,583 | 6/1981 | Tyran | 75/251 |
| 4,274,877 | 6/1981 | Collier et al. | 75/252 |
| 4,439,468 | 3/1984 | Liang et al. | 427/216 |
| 4,705,647 | 11/1987 | Yamaguchi et al. | 252/512 |
| 4,781,980 | 11/1988 | Yoshitake et al. | 428/403 |
| 4,789,411 | 12/1988 | Eguchi et al. | 148/24 |
| 4,980,086 | 12/1990 | Hiraiwa et al. | 252/511 |
| 5,015,314 | 5/1991 | Suzuki et al. | 156/89 |
| 5,045,236 | 9/1991 | Tsunaga et al. | 252/512 |
| 5,242,511 | 9/1993 | Yokoyama et al. | 148/430 |
| 5,248,451 | 9/1993 | Tsunaga et al. | 252/512 |

FOREIGN PATENT DOCUMENTS

| | | | |
|---|---|---|---|
| 0223876 | 6/1987 | European Pat. Off. | |
| 0239901 | 10/1987 | European Pat. Off. | 252/512 |
| 0403180 | 12/1990 | European Pat. Off. | |
| 60-30200 | 2/1985 | Japan | 428/405 |
| 60-243171 | 12/1985 | Japan | 252/512 |
| 60-258273A | 12/1985 | Japan | |
| 1-297475 | 11/1989 | Japan | |
| 1-304717 | 12/1989 | Japan | 252/520 |
| 2-16172 | 1/1990 | Japan | 252/512 |
| 2-18469 | 1/1990 | Japan | |
| 3-6268 | 1/1991 | Japan | 252/512 |
| 3-223371 | 10/1991 | Japan | 252/512 |
| WO89/08516 | 9/1989 | WIPO | |

OTHER PUBLICATIONS

Feeley, J. et al., "Conductive Pastes", IBM Technical Disclosure Bulletin, vol. 11, No. 7 (Dec. 1968) p. 705.

*Primary Examiner*—Terry J. Owens
*Attorney, Agent, or Firm*—Jacobson, Price, Holman & Stern

[57] ABSTRACT

A method for surface treating conductive copper powder comprises dispersing pure copper powder or silver-coated copper powder in a solution of coupling agent selected from the group consisting of silane, titanate, aluminate and zirconate and a ZB-3 treating agent which is the reaction products of peanut oil fatty acids, boric acid and triethanolamine in a molar ratio of 1:1:2 in an organic solvent, the total amount of the coupling agent and ZB-3 treating agent being controlled in the range of from 0.1% to 10%, based on the weight of the copper powder, filtering after 1 hour standing and drying at 40°–60° C. under vacuum.

6 Claims, No Drawings

METHOD FOR SURFACE TREATING CONDUCTIVE COPPER POWDER WITH A TREATING AGENT AND COUPLER

This application is a continuation-in-part of Ser. No. 07/897,654, filed Jun. 11, 1992, now abandoned.

BACKGROUND OF THE INVENTION (1) Field of the Invention

The present invention relates to a method for surface treating conductive copper powder for use in conductive pastes such as conductive inks, conductive coatings and conductive adhesives which possess excellent conductivity and environmental adaptability.

(2) Description of the Prior Art

As is known, it has long been considered to use copper powder as conductive filler in conductive paste. However, the metal copper powder, particularly the fine copper powder, can be oxidized rapidly in the air. Therefore, to prevent copper powder from oxidization is a technical problem in the development of conductive pastes. To improve oxidation resistance of copper powder so as to enable it to be used in conductive paste, various proposals, including methods of surface treating the copper powder, methods of employing additives and combinations thereof, have been made.

In the method of surface treating, the copper powder is treated with an antioxidant or coated with a metal such as tin, nickel, platinum or silver. Japanese Unexamined Patent Publication No. 113505/1982(JP57-113505A) discloses a conductive coating composition in which a tin-coated copper powder is employed as conductive filler. JP60-100679A and JP60-243277A disclose methods for coating copper powder with silver.

In the method of employing additives, reducing agent and/or coupling agent are incorporated as essential components into the conductive paste when the copper powder is dispersed in a solution of synthetic resin binder. The conductive paste thus obtained exhibits oxidation resistance to a certain extent.

In the combination method, metal-coated copper powder is treated with a coupling agent.

Examples of the materials to be used as antioxidant that may be mentioned are amines, organo-phosphorous, organo-silane, organo-aluminium and organo-titanium compounds. In U.S. Pat. No. 4,663,079, phosphites are employed; in JP61-200179A, higher fatty amines are used; in U.S. Pat. Nos. 4,305,847 and 4,382,981 and JP58-74579A and 59-75931A, 59-174661A, organo-titanium compounds are used; in JP59-179671A and JP60-3200A, organic aluminates or titanates are used; in JP62-280271A, silanes and titanates are employed.

Examples of the additives used are phosphoric acid, phosphorous acid and esters thereof, phenols and derivatives thereof, aldehydes, hydrazines, ascorbic acid, triazole derivatives, imidazole derivatives, reducing sugar and coupling agents. JP60-258273A discloses a conductive coating composition in which the copper powder employed is treated with citric acid or tartaric acid; JP57-55974A and 96401A disclose conductive coating compositions in which hydroxyphenol derivatives such as hydroquinone, catechol are added; U.S. Pat. No. 4,705,647 discloses a conductive composition in which triazole derivatives are used as additives; JP60-243171A discloses a conductive composition in which organic carboxylic acid salts of alkyl imidazoles, nitrogen- or sulfur-containing silane couplers, phosphates and/or phosphites are added.

The conductive pastes obtained according to the above-mentioned first and second methods have good initial electrical conductivity, but they have poor storage stability and environmental adaptability. The conductive pastes obtained according to the third method have better properties, but are still not ideal. In brief, of the conductive pastes afore-mentioned, some have the drawback of forming patina, some have the deficiency of aggregation and sedimentation of fillers, some change greatly in conductivity after a period of time and some do not exhibit sufficient degree of heat resistance and humidity resistance.

U.S. Pat. No. 4,781,980 discloses a method for treating copper powder on the surface of which an antioxidation film of a salt of an aliphatic mono- or di-amine, having aliphatic hydrocarbon having 12 to 22 carbon atoms, of a mono- or di-carboxylic acid, having either aliphatic hydrocarbon having 2 to 23 carbon atoms or aromatic hydrocarbon groups having 7 to 8 carbon atoms, is formed; and a film comprising a dispersing agent of the type of boron-nitrogen composite and at least one coupler selected from the group consisting of titanate and aluminate is then formed on the antioxidation film. The boron-nitrogen composite type dispersing agent is a dispersing agent in which a boron-containing surfactant substance and a nitrogen-containing surfactant substance are blended and combined each other. The boron-containing surfactant substance has in the molecule thereof a boronic acid ester bond with polyhydric alcohol, and has one or more groups of hydrocarbons having 7 to 25 carbon atoms. The nitrogen-containing surfactant substance has one or more groups of hydrocarbons having 7 to 25 carbon atoms, and has non-covalent electron pairs. The copper powder thus-obtained is capable of maintaining stable conductivity for a long period of time, and possesses a good affinity for synthetic resin and a high degree of thermal resistance.

JP02-18469A discloses a copper powder for conductive coating and conductive coating composition using same. The copper powder is coated with a zirconate compound and a hydroxyalkylamine, together with a higher fatty acid ester. The obtained copper powder thus obtained has rust proofing properties and capable of improving conductivity and environmental adaptability by adding to a coating.

As is known to the persons skilled in the art, conductive copper paste should possess excellent conductivity and generally has a volume resistance of $10^{-3}$ to $10^{-4}$ $\Omega\cdot cm$. In order to ensure this conductivity, copper powder should have good oxidation resistance. For obtaining pure copper powder, a known method is employed which comprises removing the organic protective layer (fatty acids and other organics) on the surface of the copper powder and then removing the oxides thereon with an acid.

In addition, whether the copper powder is well dispersed in binder resins would obviously affect the conductivity of the conductive copper paste. Furthermore, the storage stability and the environmental adaptability of the conductive paste are important quality indices for practical applications of the conductive paste. In general, the change of the conductivity of a conductive paste should be less than 10% . Troubles would be found in application if the limit is exceeded.

SUMMARY OF THE INVENTION

The method for surface treating conductive copper powder according to the present invention comprises dispersing pure copper powder or silver-coated copper powder having a mean particle diameter of not more than 70 μm in a dilute solution of 0.1 to 10%, based on the weight of the copper powder, of coupler and ZB-3 treating agent available from Beijing Printing Science & Technology Co., Wudaokou, Haidian District, Beijing, China, 100083, which is the reaction products of peanut oil fatty acids, boric acid and triethanolamine in a molar ratio of 1:1:2 (the ratio of the coupling agent to ZB-3 ranges from 5:95 to 95:5 by weight) in an organic solvent such as acetone and ethanol, filtering after 1 hour standing, drying at 40° to 60° C. under vacuum to obtain copper powder for use as conductive filler in conductive copper pastes.

The conductive paste prepared from copper powder according to the present invention has excellent conductivity, storage stability, dispersibility in binder resins, heat resistance and moisture resistance, and has a volume resistance of $10^{-4}$ Ω·cm.

DETAILED DESCRIPTION OF THE INVENTION

The purpose of the present invention is to provide a method for surface treating conductive copper powder. The conductive copper powder according to the present invention overcomes the disadvantages of those of the prior art.

The method for surface treating conductive copper powder disclosed herein comprises treating pure copper powder or silver-coated copper powder with complex treating agent comprising ZB-3 and a coupler selected from the group consisting of silane, aluminate, titanate and zirconate. The ratio of the selected coupler to ZB-3 ranges from 5:95 to 95:5 by weight, preferably from 30:70 to 70:30 by weight. The treating method comprises dissolving the complex treating agent in an organic solvent to form a dilute solution; dispersing the copper powder in the solution; filtering after 1 hour standing, and drying at 40° to 60° under vacuum to obtain the conductive copper powder for further use.

There are no particular restrictions to the organic solvent so long as it is able to dissolve the complex treating agent. Examples of the solvent include asetone, ethanol, butyl acetate, toluene, xylene, diethyl ether and diisopropyl ether etc.

The conductive copper powder according to the present invention is characterized in that: (1) it has excellent oxidation resistance, (2) it has excellent dispersibility in binder resins, and (3) it renders the conductive copper paste employing the same excellent properties of conductivity, storage stability and environmental adaptability.

There are no particular restrictions to the preparation of the raw copper powder. Any raw copper powder prepared by pulverizing process, electrolytic process, atomizing process, or reduction process could be employed. Electrolytic process is particularly preferred since copper powder prepared by such process gives a paste exhibiting high conductivity. The shape of the copper powder may be in any form of flake, spherical, dendrite or irregular. The mean particle diameter of the copper powder according to the present invention is not more than 70 μm, preferably not more than 20 μm.

It is necessary to remove the organic protective layer and oxidized layer on the surface of the copper powder prior to the treatment of the copper powder by using solvent process, emulsion process or saponification process, then dissolving the oxidized layer with an acid, and wash the copper powder thus treated with water until the filtrate is neutral to obtain pure copper powder. Examples of the acids suitable for removing oxidized layer on the surface of the copper powder according to the present invention are inorganic acids such as hydrochloric acid and sulfuric acid; monocarboxylic acids such as acetic acid and propionic acid; non-substituted polycarboxylic acids such as succinic acid and tricarballylic acid; and hydroxy carboxylic acids such as lactic acid, tartaric acid, malic acid, citric acid, gluconic acid and glycolic acid. Among these acids, organic carboxylic acids are preferred, and hydroxy carboxylic acids are more preferred.

If it is desired to coat a metal layer on the surface of the copper powder, processes such as chemical replacement, chemical reduction or chemical vapor deposition (CVD) can be employed. The type and percentage of the metal coated on the surface of the copper powder may influence the conductivity, storage stability and environmental adaptability of the copper powder. It is preferable to coat the copper powder with 1 to 10% of silver based on the weight of the copper powder.

The coupling agent to be used in the present invention is selected from the group consisting of silanes such as γ-aminopropyl triethoxy silane, γ-glycidylpropyl trimethoxy silane, γ-methacryloxypropyl trimethoxy silane, γ-thiopropyl trimethoxy silane, and γ-chloropropyl triethoxy silane; titanates such as isopropyl triisostearoyl titanate, isopropyl tri(dioctyl) pyrophosphato titanate, di(dioctyl) pyrophosphato oxoethylene titanate, di(dioctyl) phosphato ethylene titanate, di(dioctyl) pyrophosphato ethylene titanate, tetraoctyl titanate di(ditridecyl) phosphite, and dialkoxy bis(triethanolamine) titanate; aluminates such as diisopropyl acetoalkoxy aluminate, isopropyl diisostearoyl aiuminate, and isopropyl dioctyl phosphato aluminate; and zirconates such as isopropyl triisostearoyl zirconate, butyl triisostearoyl zirconate, butyl trioleoyl zirconate, isopropyl trilinoleoyl zirconate, di(cumyl)phenyl oxoethylene zirconate, di(cumyl)phenyl dibutyl zirconate and tri(cumyl)phenyl propyl zirconate.

Said ZB-3 treating agent used in the present invention is the reaction products of peanut oil fatty acids, boric acid and triethanolamine in a molar ratio of 1:1:2, and the amount of peanut oil fatty acid is determined by acid value. Generally, the peanut oil fatty acids consist of 61% oleic acid, 22% linoleic acid and 17% other fatty acids. ZB-3 treating agent could be considered as a blend of triethanolamine salt of peanut oil fatty acids and triethanolamine salt of boric acid in a molar ratio of 1:1. ZB-3 treating agent has several different functional groups in the molecule thereof, the long unsaturated fatty acid chain possesses reductive property and gives a good affinity for binder resins, the alkanolamine group exhibits oxidation resistance, and the boron-containing group improves the thermal resistance of the protective film of the treated copper powder. Therefore, ZB-3 treating agent plays an important role in the surface treatment of the copper powder. In addition, alkanolamines such as monoethanolamine, diethanolamine and the like could be used instead of triethanolamine, but triethanolamine is particularly preferred because it gives a better reductive property to ZB-3 treating agent.

It is recommended that the total amount of coupling agent and ZB-3 should be controlled within the range from 0.1 to 10%, preferably from 0.5 to 5% based on the weight of the copper powder. If the amount is less than 0.1%, the surface of the copper powder will not be coated completely and thus it is not as effective. If the amount exceeds 10%, it will impair other properties of the copper powder.

When conductive paste is prepared by employing copper powder according to the present invention, additives such as sedimentation-preventing agent, co-dispersant and/or fire-retardant can be incorporated into the conductive copper paste composition, if necessary.

The following examples will further illustrate the present invention in detail. In these examples, "parts" means "parts by weight", and "%" means "% by weight". It should be understood, however, that the present invention is by no means restricted by these specific examples.

EXAMPLE 1

In a solution of 2 parts of complex treating agent of isopropyl triisostearoyl titanate and ZB-3 in a ratio of 1:1 by weight were dispersed 100 parts of pure copper powder having a mean particle diameter of about 10 μm. The mixture was filtered after 1 hour standing, and then dried at 50° C. for 1.5 hours under vacuum to obtain a treated copper powder.

85 parts of the treated copper powder were thoroughly mixed with the components hereinbelow listed to formulate a conductive coating composition:

| | |
|---|---|
| Acrylic resin (solid content 50%) | 50 parts |
| Butyl acetate | 25 parts |
| Butyl cellosolve | 25 parts |

The obtained conductive coating composition was air sprayed on ABS plates of 10×10cm size to form 30 μm thick coating films. The surface resistances of the dried films were measured by a digital ohmmeter. Then the coated plates were left respectively in an air oven at 70° C. for 100 hours (heat resistance test) and at 70° C. and a relative humidity of 95% for 100 hours (humidity resistance test), and the surface resistances of the tested plates were measured. All the results are shown in Table 1.

EXAMPLE 2

The treatment process, conductive coating composition and tests were in a similar manner as described in Example 1 except that 2% silver-coated copper powder was used instead of pure copper powder. The results are also shown in Table 1.

TABLE 1[1]

| Example | 1 | 2 |
|---|---|---|
| Pure Cu powder | 100 | |
| Ag-Cu powder | | 100 |
| TC-1 | 1.0 | 1.0 |
| ZB-3 | 1.0 | 1.0 |
| $R_0$ (Ω/sq) | 0.2 | 0.1 |
| $R_1$ (Ω/sq) | 0.2 | 0.1 |
| $R_2$ (Ω/sq) | 0.3 | 0.1 |

Note[1]:
TC-1: isopropyl triisostearyl titanate;
$R_0$: initial surface resistance of the test plate;
$R_1$: surface resistance after heat resistance test;
$R_2$: surface resistance after humidity resistance test.

EXAMPLES 3–10

The treatment process, conductive coating composition and tests were in a similar manner as described in Example 1 except that the copper powder, coupler, and the ratio of coupler to ZB-3 were varied as shown in Table 2. The results are also shown in Table 2.

TABLE 2[2]

| Example | 3 | 4 | 5 | 6 | 7 | 8 | 9 | 10 |
|---|---|---|---|---|---|---|---|---|
| Pure Cu powder | 100 | | 100 | 100 | 100 | 100 | 100 | 100 |
| Ag-Cu powder | | 100 | | | | | | |
| TC-2 | 2.0 | | | | | | | |
| TC-3 | | 2.0 | | | | | | |
| AC-1 | | | 1.0 | | | | | |
| AC-2 | | | | 1.0 | | | | |
| ZC-1 | | | | | 2.0 | | | |
| ZC-2 | | | | | | 3.0 | | |
| SC-1 | | | | | | | 1.0 | |
| SC-2 | | | | | | | | 1.0 |
| ZB-3 | 2.0 | 1.0 | 1.0 | 2.0 | 1.0 | 2.0 | 2.0 | 1.0 |
| $R_0$ (Ω/sq) | 0.2 | 0.1 | 0.2 | 0.2 | 0.2 | 0.2 | 0.2 | 0.2 |
| $R_1$ (Ω/sq) | 0.2 | 0.1 | 0.2 | 0.2 | 0.2 | 0.2 | 0.2 | 0.2 |
| $R_2$ (Ω/sq) | 0.2 | 0.1 | 0.3 | 0.2 | 0.2 | 0.2 | 0.2 | 0.2 |

Note[2]:
TC-2: dibutoxy bis(triethanolamine) titanate;
TC-3: Bis(dioctyl) phosphato ethylene titanate;
AC-1: acetoalkoxy diisopropyl aluminate;
AC-2: isopropyl diisostearyl aluninate;
ZC-1: propyl triisostearyl zirconate;
ZC-2: tri(cumyl)phenyl propyl zirconate;
SC-1: γ-aminopropyl triethoxy silane;
SC-2: γ-methacryloxypropyl trimethoxy silane;
$R_0$, $R_1$, $R_2$ and have the same meanings as in Table 1.

What is claimed is:

1. A method for surface treating conductive copper powder which comprises dispersing pure copper powder or silver-coated copper powder in a dilute solution of treating agent which is the reaction products of peanut oil fatty acids, boric acid and triethanolamine in a molar ratio of 1:1:2 and a coupler selected from the group consisting of silane, titanate, aluminate and zirconate in an organic solvent, filtering after 1 hour standing and then drying at 40° to 60° C. under vacuum.

2. The method of claim 1 wherein the ratio of coupler to ZB-3 ranges from 5:95 to 95:5 by weight.

3. The method of claim 1 wherein the total amount of coupling agent and ZB-3 is from 0.1 to 10% based on the weight of the copper powder.

4. The method of claim 1 wherein the ratio of coupler to ZB-3 ranges from 30:70 to 70:30 by weight.

5. The method of claim 1 wherein the total amount of coupling agent and ZB-3 is from 0.5 to 5% based on the weight of the copper powder.

6. Conductive copper powder obtained by the method according to claim 1.

* * * * *